(12) United States Patent
Kates

(10) Patent No.: US 7,630,507 B2
(45) Date of Patent: Dec. 8, 2009

(54) BINAURAL COMPRESSION SYSTEM

(75) Inventor: James M. Kates, Niwot, CO (US)

(73) Assignee: GN Resound A/S (DK)

( * ) Notice: Subject to any disclaimer, the term of this patent is extended or adjusted under 35 U.S.C. 154(b) by 504 days.

(21) Appl. No.: 10/353,187

(22) Filed: Jan. 27, 2003

(65) Prior Publication Data

US 2004/0190734 A1  Sep. 30, 2004

Related U.S. Application Data

(60) Provisional application No. 60/352,295, filed on Jan. 28, 2002.

(51) Int. Cl.
 *H04R 25/00* (2006.01)
(52) U.S. Cl. .................... 381/312; 381/106
(58) Field of Classification Search ............. 381/106, 381/57, 1, 17–18, 23, 94.3, 94.8, 101–103, 381/107–108, 321, 312, 314; 333/14
See application file for complete search history.

(56) References Cited

U.S. PATENT DOCUMENTS

| | | | | |
|---|---|---|---|---|
| 4,237,343 A | * | 12/1980 | Kurtin et al. .................. 381/63 |
| 4,342,059 A | * | 7/1982 | Wray ..................... 360/123.01 |
| 4,866,774 A | * | 9/1989 | Klayman ...................... 381/1 |
| 5,210,796 A | * | 5/1993 | Hirabayashi et al. ........... 381/12 |
| 5,333,201 A | * | 7/1994 | Waller, Jr. ..................... 381/22 |
| 5,412,731 A | * | 5/1995 | Desper ........................ 381/1 |
| 5,440,638 A | * | 8/1995 | Lowe et al. .................... 381/17 |
| 5,479,522 A | * | 12/1995 | Lindemann et al. ........ 381/23.1 |
| 5,757,932 A | | 5/1998 | Lindemann et al. |
| 5,872,851 A | * | 2/1999 | Petroff ........................ 381/18 |
| 6,081,603 A | * | 6/2000 | Engh et al. .................. 381/120 |
| 6,937,738 B2 | * | 8/2005 | Armstrong et al. .......... 381/312 |
| 6,970,570 B2 | * | 11/2005 | Goldstein ................... 381/321 |

* cited by examiner

*Primary Examiner*—Vivian Chin
*Assistant Examiner*—Lun-See Lao
(74) *Attorney, Agent, or Firm*—Vista IP Law Group, LLP.

(57) ABSTRACT

A multi-channel signal processing system adapted to provide binaural compressing of tonal inputs is provided. Such a system can be used, for example, in a binaural hearing aid system to provide the dynamic-range binaural compression of the tonal inputs. The multi-channel signal processing system is essentially a system with two signal channels connected by a control link between the two signal channels, thereby allowing the binaural hearing aid system to model behaviors, such as crossed olivocochlear bundle (COCB) effects, of the human auditory system that includes a neural link between the left and right ears. The multi-channel signal processing system comprises first and second channel compressing units respectively located in first and second signal channels of the multi-channel signal processing system. The first and second channel compressing units receive first and second channel input signals, respectively, to generate first and second channel compressed outputs. The multi-channel signal processing system further includes peak detecting means detecting signal peaks of the first and second channel input signals for generating first and second channel control signals. Thereafter, gain adjusting means adjusts signal gains of the first and second channel control signals. The first and second channel compressing units then respectively compress the first and second channel input signals to produce the first and second channel compressed outputs in accordance with the adjusted first and second channel control signals, respectively.

43 Claims, 9 Drawing Sheets

BINAURAL COMPRESSION SYSTEM

CROSS-REFERENCE TO RELATED APPLICATION

This application claims benefit from U.S. Provisional Application Ser. No. 60/352,295, filed Jan. 28, 2002.

FIELD OF THE INVENTION

The present invention relates to apparatus and methods for dynamic-range compression in audio systems such as hearing aids.

DESCRIPTION OF PRIOR ART

A hearing impaired person by definition suffers from a loss of hearing sensitivity. Such a hearing loss generally depends upon the frequency and/or the audible level of the sound in question. Thus, a hearing impaired person may be able to hear certain frequencies (e.g., low frequencies) as well as a non-hearing impaired person, but unable to hear sounds with the same sensitivity as the non-hearing impaired person at other frequencies (e.g., high frequencies). Similarly, the hearing impaired person may be able to hear loud sounds as well as the non-hearing impaired person, but unable to hear soft sounds with the same sensitivity as the non-hearing impaired person. Thus, in the latter situation, the hearing impaired person suffers from a loss of dynamic range of the sounds.

A variety of analog and digital hearing aids have been designed to mitigate the above-identified hearing deficiencies. For example, frequency shaping techniques can be used to contour the amplification provided by a hearing aid, thus matching the needs of an intended user suffering from the frequency dependent hearing losses. With respect to the dynamic range loss, typically a compressor is used to compress the dynamic range of an input sound so that it more closely matches the dynamic range of the intended user. The ratio of the input dynamic range to the output dynamic range by the compressor is referred to as the compression ratio. Generally, the compression ratio required by a hearing aid user is not constant over the entire input power range because the degree of hearing loss at different frequency bands of the user is different.

Dynamic range compressors are designed to perform differently in different frequency bands, thus accounting for the frequency dependence (i.e., frequency resolution) of the intended user. Such a multi-channel or multi-band compressor divides an input signal into two or more frequency bands and then compresses each band separately. This design allows greater flexibility in varying not only the compression ratio, but also time constants associated with each frequency band. The time constants are referred to as the attack and release time constants. The attack time is the time required for a compressor to react and lower the gain at the onset of a loud sound. Conversely, the release time is the time required for the compressor to react and increase the gain after the cessation of the loud sound.

Moreover, many hearing-impaired individuals have hearing losses in both ears. As a result, each of these individuals needs to be fitted with two hearing aids, one for each ear, to address the hearing losses of both ears. Both hearing aids may contain dynamic-range compression circuits, noise suppression processing, and/or directional microphones. In general, the two hearing aids contain same signal processing circuits and algorithms, and operate independently. That is, the signal processing in each of the hearing aids is adjusted separately and operates without any consideration for the presence of the other hearing aid. Improved performance is possible if input signals from both sides of the intended user's head are combined to provide binaural processing.

Some conventional hearing aid systems have been built using wires to get a signal from one side of the head to the other. An example of such a system is a CROS (contralateral routing of signal) hearing aid configuration. Such a CROS system is typically used for an individual with a unilateral hearing loss, i.e., with only one impaired ear. In a CROS fitting, the signal originating from the side of the head of the impaired ear is picked up using a microphone, amplified, and presented to the good ear using a hearing aid receiver and an open earmold. The open earmold does not impede an acoustic signal originating from the side of the good ear, and thus allows the amplified signal originating from the side of the impaired ear to be combined acoustically with the signal originating on the side of the head having the good ear. The combined acoustic plus the amplified signal allows the unilaterally-impaired listener to hear speech originating on either side of the head.

A BICROS configuration is another conventional hearing aid system used for individuals with bilateral hearing losses. In a BICROS arrangement, the signals originating on both sides of the head are summed, amplified, and presented to an ear having the better hearing. In both the CROS and BICROS systems, however, only one ear of the user is used to listen to the acoustic signals. Accordingly, any potential advantage of listening with both ears is lost in these systems, and the ability to determine the direction of a source of sound is also diminished.

Furthermore, a conventional digital hearing aid includes a digital signal processor for digitally processing the input acoustic signals. Generally, the digital hearing aid allows for more sophisticated signal processing techniques than an analog hearing aid. For example, the digital hearing aid can provide combined processing of the signals at the two ears of the user. Such an improved signal processing system has been disclosed by several persons. For instance, U.S. Pat. No. 5,757,932 to Lindemann et al. (hereinafter the '932 patent) teaches a signal processing system in which two microphones, two digital signal processors, and two hearing aid receivers are used in a binaural system having a signal link between the two digital signal processors. The signal link can be a wire or a wireless communication channel. Actual signal processing algorithms used to provide the binaural signal processing, however, are not described in the '932 patent. Thus this patent discloses only a general framework for binaural signal processing, but does not teach any specific binaural processing approach.

Another digital hearing aid system providing the binaural processing approach is presented by U.S. Pat. No. 5,479,522 to Lindemann and Melanson (hereinafter the '522 patent). The system disclosed in the '522 patent is intended to pass signals coming from in front of a listener without attenuation, and to attenuate diffuse noise signals or signals coming from the sides of the listener. An amount of correlation between the signals at the left and right ears is calculated and used to adjust the hearing aid gain. The gain of the hearing aid is high if the amount of correlation between the left and right ear signals is high, and the gain is reduced as the amount of correlation decreases. The signal correlation is computed as a function of signal frequency, and the gain adjustments are hence also frequency-dependent. On the other hand, the same amount of gain reduction as a function of frequency is applied to the signals presented to the left and right ears. Thus this system passes signals without changing the frequency regions where the signals are similar at the two ears, and attenuates those frequency regions where the signals differ. Clinical tests indicate that this and other similar systems, however, do not improve speech intelligibility in noise for hearing-impaired listeners when compared to binaural listening using amplification without such additional binaural processing.

The system described in the '522 patent by Lindemann and Melanson adds binaural signal attenuation to the dynamic-range compression already present in many of the conventional hearing aids. Nonetheless, its signal compression processing, which operates independently on the left and right ear signals and provides separate left and right signal gains, is not modified in accordance with the binaural processing. In contrast, an unimpaired human auditory system provides a neural linkage between the left and right ears that appears to dynamically adjust the compression behavior in the cochlea of each ear in accordance with the binaural processing response. Thus, the binaural response due to this linkage of the healthy human auditory system has been ignored in the conventional hearing aid design. Adjusting the dynamic-range compression behavior in the binaural hearing aids to more closely match that which occurs binaurally in healthy ears would therefore be an innovative alternative to the Lindemann and Melanson approach based on passing signals that are similar and attenuating signals that differ at the two ears.

Consequently, a need remains in the art for apparatus and methods to provide binaural hearing aid signal processing that improves speech intelligibility in noisy environments.

SUMMARY OF THE INVENTION

A multi-channel, such as a dual-channel, signal processing system adapted to provide binaural compressing of tonal inputs is provided. Such a system can be used, for example, in a binaural hearing aid system to provide a dynamic-range binaural compression of the tonal inputs. The multi-channel signal processing system is essentially a system with at least two signal channels, one signal channel at each side, for processing binaural compression of tonal inputs. The two signal channels are connected by a control link, thereby allowing the binaural hearing aid system to model behaviors, such as crossed olivocochlear bundle (COCB) effects, of the human auditory system that includes a neural link between the left and right ears. Alternatively, the multi-channel signal processing system may have more than one signal channel at one side, making the total signal channel number of the multi-channel signal processing system to more than two. At least one signal channel of each side, however, should be connected by a control link to a signal channel of another side. As a result, it is possible that some, but not all, of the signal channels of the multi-channel signal processing system are cross-suppressed. Moreover, the multi-channel signal processing system comprises at least first and second channel compressing units respectively located in the first and second signal channels at opposite sides of the multi-channel signal processing system. The first and second channel compressing units receive first and second channel input signals, respectively, to generate first and second channel compressed outputs. The multi-channel signal processing system further includes peak detecting means detecting signal peaks of the first and second channel input signals for generating first and second channel control signals. Thereafter, gain adjusting means adjusts signal gains of the first and second channel control signals. The first and second channel compressing units then respectively compress the first and second channel input signals to produce the first and second channel compressed outputs in accordance with the adjusted first and second channel control signals, respectively.

Thus, in one aspect, the invention is a dual-channel signal compressor such as used in a binaural hearing aid system, the dual-channel signal compressor comprised of first and second channel compressing units respectively located in the first and second signal channels for compressing the first and second channel input signals. The dual-channel signal compressor further comprises peak detecting means detecting signal peaks of the first and second channel input signals for generating first and second channel control signals. The first and second channel control signals are a weighted combination of peak-detected signals derived from the first and second channel input signals. Thereafter, gain adjusting means adjusts signal gains of the first and second channel control signals. The first and second channel compressing units then respectively compress the first and second channel input signals to produce the first and second channel compressed outputs in accordance with the adjusted first and second channel control signals, respectively. In a preferred embodiment, the dual-channel signal compressor further comprises a maximum determining means for determining maximum signals of the first and second channel input signals prior to the peak detection of the first and second channel input signals. In this preferred embodiment, the first and second channel control signals are identical to each other. In another preferred embodiment, the peak detecting means comprises first and second channel peak detectors respectively located in the first and second signal channels. The gain adjusting means comprises first and second channel gain adjustors respectively located in the first and second signal channels. The dual-channel signal compressor further comprises first and second channel gain control units, respectively located in the first and second signal channels, for generating the first and second channel control signals in accordance with the detected signal peaks of the first and second channel input signals. In yet another preferred embodiment, the first channel gain control unit comprises a first channel logarithm converter converting the detected signal peaks of the first channel input signal into first channel logarithms, a first channel multiplier multiplying the first channel logarithms by a predetermined factor, and a first channel adder. The second channel gain control unit comprises a second channel logarithm converter converting the detected signal peaks of the second channel input signal into second channel logarithms, a second channel multiplier multiplying the second channel logarithms by the predetermined factor, and a second channel adder. The first channel adder adds the first channel logarithms and the second channel logarithms multiplied with the predetermined factor, and the second channel adder adds the second channel logarithms and the first channel logarithms multiplied with the predetermined factor. Outputs of the first and second channel adders are respectively supplied to the first and second channel gain adjustors. In yet another embodiment, the first channel peak detector comprises first and second peak detecting units detecting signal peaks of the first channel input signal. The second channel peak detector comprises third and fourth peak detecting units detecting signal peaks of the second channel input signal. The first channel logarithm converter includes first and second logarithm units respectively converting the detected signal peaks from the first and second peak detecting units, and the second channel logarithm converter includes third and fourth logarithm units respectively converting the detected signal peaks from the third and fourth peak detecting units. The first channel multiplier multiplies outputs of the second logarithm unit by a predetermined factor and the second channel multiplier multiplies outputs of the third logarithm unit by the predetermined factor. The first channel adder adds outputs of the first logarithm unit and outputs of the second channel multiplier, and the second channel adder adds outputs of the fourth logarithm unit and outputs of the first channel multiplier.

In another aspect, the invention is a dual-channel signal compressor such as used in a binaural hearing aid system, the dual-channel signal compressor comprised of first and second channel compressing units respectively located in the first and second signal channels for compressing the first and second channel input signals. The dual-channel signal compressor further comprises first and second channel peak detectors detecting signal peaks of the first and second channel input signals for generating first and second channel control signals. First and second channel gain adjustors respectively adjust signal gains of the first and second channel control signals. The first and second channel compressing units then respectively compress the first and second channel input signals to produce first and second channel compressed signals in accordance with the adjusted first and second channel control signals, respectively. Thereafter, first and second channel attenuators respectively attenuate the first and second channel compressed signals to produce first and second channel compressed outputs. The dual-channel signal compressor further includes a first feedback peak detector detecting signal peaks of the first channel compressed output and a second feedback peak detector detecting signal peaks of the second channel compressed output. The first and second channel attenuators respectively have attenuation factors generated in accordance with the detected signal peaks of the second and first channel compressed outputs.

In yet another aspect, the invention is a dual-channel signal compressor such as used in a binaural hearing aid system, the dual-channel signal compressor comprised of first and second channel compressing units respectively located in the first and second signal channels for compressing the first and second channel input signals. The first and second channel compressing units are respectively adapted to compress a plurality of frequency bands of the first and second channel input signals. The dual-channel signal compressor further comprises peak detecting means detecting signal peaks of the first and second channel input signals for generating first and second channel control signals. Each of the first and second channel control signals at each frequency band is respectively a weighted combination of peak-detected signals derived from the first and second channel input signals. Thereafter, gain adjusting means adjusts signal gains of the first and second channel control signals. The first and second channel compressing units then respectively compress the first and second channel input signals to produce the first and second channel compressed outputs in accordance with the adjusted first and second channel control signals, respectively. In a preferred embodiment, the dual-channel signal compressor further comprises a maximum determining means for determining maximum signals of the first and second channel input signals prior to the peak detection of the first and second channel input signals. In this embodiment, the first and second channel control signals are identical to each other. In another preferred embodiment, the peak detecting means comprises first and second channel peak detectors respectively located in the first and second signal channels. The gain adjusting means comprises first and second channel gain adjustors respectively located in the first and second signal channels. The dual-channel signal compressor further comprises first and second channel gain control units, respectively located in the first and second signal channels, for generating the first and second channel control signals in accordance with the detected signal peaks of the first and second channel input signals. In yet another preferred embodiment, the first channel gain control unit comprises a first channel logarithm converter converting the detected signal peaks of the first channel input signal into first channel logarithms, a first channel multiplier multiplying the first channel logarithms by a predetermined factor, and a first channel adder. The second channel gain control unit comprises a second channel logarithm converter converting the detected signal peaks of the second channel input signal into second channel logarithms, a second channel multiplier multiplying the second channel logarithms by the predetermined factor, and a second channel adder. The first channel adder adds the first channel logarithms and the second channel logarithms multiplied with the predetermined factor, and the second channel adder adds the second channel logarithms and the first channel logarithms multiplied with the predetermined factor. Outputs of the first and second channel adders are respectively supplied to the first and second channel gain adjustors. In yet another preferred embodiment, the first channel peak detector comprises first and second peak detecting units detecting signal peaks of the first channel input signal. The second channel peak detector comprises third and fourth peak detecting units detecting signal peaks of the second channel input signal. The first channel logarithm converter includes first and second logarithm units respectively converting the detected signal peaks from the first and second peak detecting units, and the second channel logarithm converter includes third and fourth logarithm units respectively converting the detected signal peaks from the third and fourth peak detecting units. The first channel multiplier multiplies outputs of the second logarithm unit by the predetermined factor, and the second channel multiplier multiplies outputs of the third logarithm unit by the predetermined factor. The first channel adder adds outputs of the first logarithm unit and outputs of the second channel multiplier, and the second channel adder adds outputs of the fourth logarithm unit and outputs of the first channel multiplier.

In yet another aspect, the invention is a dual-channel signal compressor such as used in a binaural hearing aid system, the dual-channel signal compressor comprised of first and second channel compressing units respectively located in the first and second signal channels for compressing the first and second channel input signals. The first and second channel compressing units are respectively adapted to compress a plurality of frequency bands of the first and second channel input signals. The dual-channel signal compressor further comprises first and second channel peak detectors detecting signal peaks of the first and second channel input signals for generating first and second channel control signals. Each of the first and second channel control signals at each frequency band is weighted combination of peak-detected signals derived from the first and second channel input signals, respectively. First and second channel gain adjustors respectively adjust signal gains of the first and second channel control signals. The first and second channel compressing units then respectively compress the first and second channel input signals to produce first and second channel compressed signals in accordance with the adjusted first and second channel control signals, respectively. Thereafter, first and second channel attenuators respectively attenuate the first and second channel compressed signals to produce first and second channel compressed outputs. The dual-channel signal compressor further includes a first feedback peak detector detecting signal peaks of the first channel compressed output and a second feedback peak detector detecting signal peaks of the second channel compressed output. The first and second channel attenuators respectively have attenuation factors generated in accordance with the detected signal peaks of the second and first channel compressed outputs.

In yet another aspect, the invention is a method for binaural signal compressing such as used in a binaural hearing aid system, the method comprising the steps of receiving first and second channel input signals respectively by first and second channel compressing units, determining first and second channel gain control signals, adjusting signal gains of the first and second channel gain control signals, and generating first and second channel compressed signals by compressing first and second channel input signals using the first and second channel compressing units in accordance with the adjusted first and second channel gain control signals, respectively. In a preferred embodiment, the first and second channel gain control signals are weighted combination of signals derived from the first and second channel input signals. In another preferred embodiment, the method further comprises the step of detecting signal peaks respectively of the first and second channel input signals. In yet another preferred embodiment, the method further comprises, prior to the step of detecting signal peaks, the step of determining first and second channel maximum signals respectively of the first and second channel input signals. In yet another preferred embodiment, the step of determining the first and second channel gain control signals comprises the steps of converting the detected signal peaks of the first and second channel input signals respectively into first and second channel logarithms, multiplying the first and second channel logarithms respectively by a predetermined factor, adding the first channel logarithms with the second channel logarithms multiplied by the predetermined factor, and adding the second channel logarithms with the first channel logarithms multiplied by the predetermined factor. In yet another preferred embodiment, the method further comprises the steps of generating first and second channel output signals by respectively attenuating the first and second channel compressed signals using first and second channel attenuators, detecting signal peaks of the first and second channel output signals, and controlling attenuating factors of the first and second channel attenuators in accordance with the detected signal peaks of the second and first channel output signals, respectively, to generating the first and second channel output signals.

In yet another aspect, the invention is a method for binaural signal compressing such as used in a binaural hearing aid system, the method comprising the steps of receiving first and second channel input signals respectively by first and second channel compressing units, determining first and second channel gain control signals, adjusting signal gains of the first and second channel gain control signals, and generating first and second channel compressed signals by compressing first and second channel input signals using the first and second channel compressing units in accordance with the adjusted first and second channel gain control signals, respectively. The first and second channel compressing units compress a plurality of frequency bands of the first and second channel input signals to generate a plurality of frequency bands of the first and second channel compressed signals. In a preferred embodiment, the first and second channel gain control signals are weighted combination of signals derived from the first and second channel input signals. Each of the first and second channel gain control signals at each frequency band is a weighted combination of signals derived from the first and second channel input signals, respectively. In another preferred embodiment, the method further comprises the step of detecting signal peaks respectively of the first and second channel input signals. In yet another preferred embodiment, the method further comprises, prior to the step of detecting signal peaks, the step of determining first and second channel maximum signals respectively of the first and second channel input signals. In yet another preferred embodiment, the step of determining the first and second channel gain control signals comprises the steps of converting the detected signal peaks of the first and second channel input signals respectively into first and second channel logarithms, multiplying the first and second channel logarithms respectively by a predetermined factor, adding the first channel logarithms with the second channel logarithms multiplied by the predetermined factor, and adding the second channel logarithms with the first channel logarithms multiplied by the predetermined factor. In yet another preferred embodiment, the method further comprises the steps of generating first and second channel output signals by respectively attenuating the first and second channel compressed signals using first and second channel attenuators, detecting signal peaks of the first and second channel output signals, and controlling attenuating factors of the first and second channel attenuators in accordance with the detected signal peaks of the second and first channel output signals, respectively, to generating the first and second channel output signals.

A further understanding of the nature and advantages of the present invention may be realized by reference to the remaining portions of the specification and the drawings.

DESCRIPTION OF THE PREFERRED EMBODIMENTS

Figure 1:
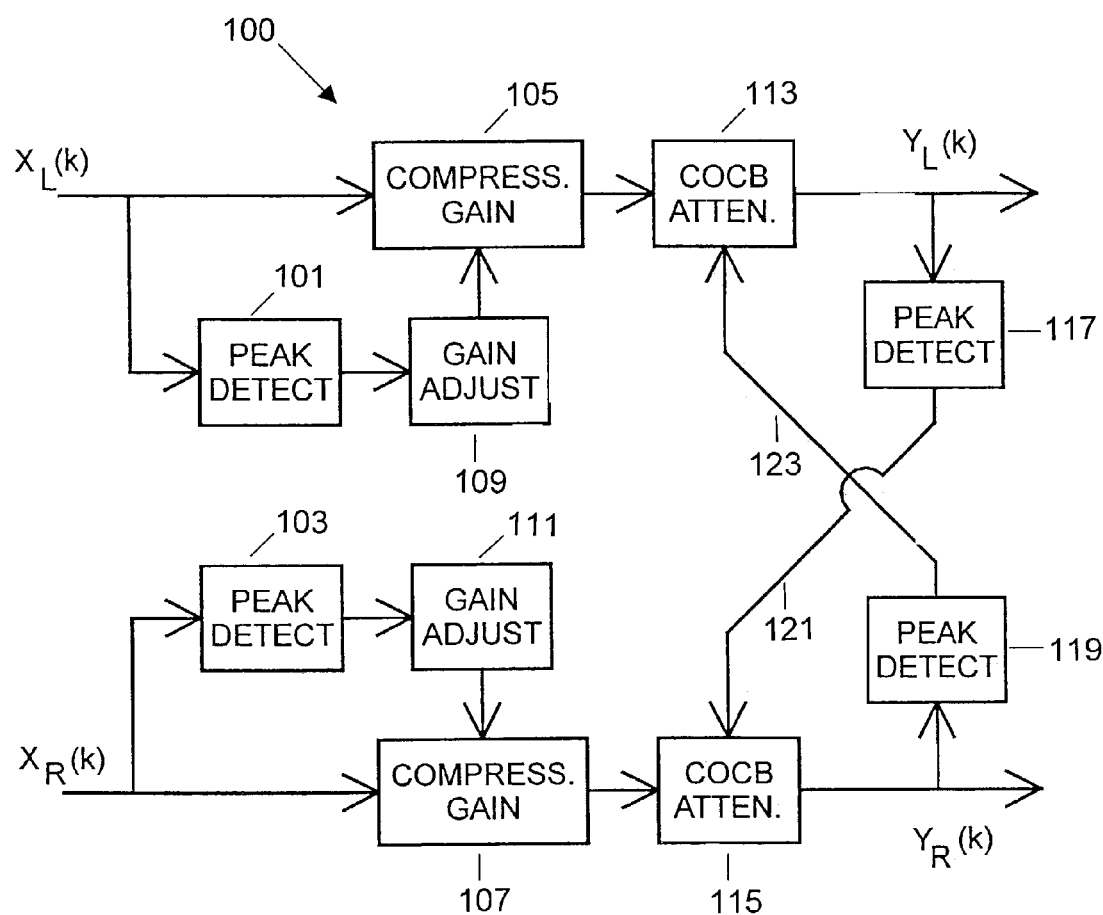
FIG. 1 illustrates a feed-forward binaural cochlear compressor with crossed COCB feedback linkages according to the present invention.

FIG. 1 is a simplified block diagram of an acoustic signal processing model (i.e., a binaural cochlear model) illustrating a dual-channel signal processing system according to a preferred embodiment of the present invention, used herein for exemplary purposes only. In the preferred embodiment, the dual-channel signal processing system includes a feed-forward binaural cochlear compressor 100 and can be used in a digital hearing aid system (not shown). It is understood that the signal processing system of the present invention can also be used in other applications, such as audio systems, audio broadcasting, telephony, and the like. It should also be understood that the digital hearing aid system can include an in-the-canal, in-the-ear, behind-the-ear, or otherwise mounted hearing aid. It should also be understood that depending upon the techniques employed within a signal processing system of a hearing aid, the hearing aid can represent either a prior art hearing aid or a hearing aid in accordance with the present invention.

Auditory Efferent Effects

The human auditory system contains two types of neural fibers, namely afferent fibers and efferent fibers. Afferent fibers carry sensory input signals from the auditory periphery of the human auditory system up to the brain, and efferent fibers carry control signals from the brain back to the auditory periphery. In addition, the human auditory system includes a crossed olivocochlear bundle (COCB) that connects the superior olive to the cochlea of the human ear. The COCB also provides a pathway for neural signals at one ear of a person to modify behaviors of the cochlea in the opposite ear of that person. The ear receiving a desired sound is termed the ipsilateral ear, and the ear on the opposite side of the head is termed the contralateral ear. If the person's auditory system is healthy, stimulating his/her COCB, either electrically or by the presentation of a sound to the contralateral ear, would cause a reduction in the cochlear sensitivity to sounds presented to the ipsilateral ear. Such a phenomenon is called the COCB inhibition effect.

Many experimental results indicate that the inhibition of the cochlear sensitivity caused by the COCB appears to be related to changes in the mechanical behavior of the cochlea. By the same token, the hearing loss can also be related to the mechanical damage of the cochlea. As a result, one would expect that many ears exhibiting a loss of hearing sensitivity would also exhibit a reduction in COCB effects in the ears. One goal of a binaural compression algorithm used in a hearing aid system should therefore be the simulation of healthy COCB effects for the damaged ear.

Experimental measurements have indicated that the maximum amount of COCB inhibition effects resulting from a contralateral acoustic masker is about 20 dB. In general, sounds must be more intense than 30-40 dB SPL (sound pressure level) to trigger the COCB effects, and the amount of the COCB inhibition appears to be proportional to the signal level of the contralateral acoustic masker above such threshold. The COCB inhibition also appears to be frequency-selective, with a narrow-band signal at the contralateral ear causing a reduction in the cochlear sensitivity only in the corresponding frequency region in the ipsilateral ear. According to the experimental measurements, the temporal course of the COCB inhibition suggests the attack and release time constants of the COCB lying in the range of 20-60 millisecond for healthy ears.

Auditory Efferent Model

A simple but effective model of the human cochlea is a parallel filter bank with independent ipsilateral signal compression in each frequency band. Auditory efferents of the human auditory system can be added to this model by providing attenutation linked to contralateral compressed outputs. FIG. 1 shows a simplified block diagram of the binaural cochlear model according to the preferred embodiment of the present invention. More specifically, one frequency band of a multi-band binaural signal processing system according to the preferred embodiment is illustrated in FIG. 1. As shown in FIG. 1, the signal processing system includes feed-forward binaural cochlear compressor 100 with crossed COCB feedback linkages. The binaural cochlear compressor 100 has left and right channels, which are identical to each other, and input signals $X_L(k)$ and $X_R(k)$ of binaural cochlear compressor 100 are received by the left and right channels, respectively. In the left channel, peak detector 101 detects the peak power of the left channel input signal $X_L(k)$ in the frequency band for the purpose of gain adjustment. Gain adjustor 109 adjusts a signal gain of the input signal $X_L(k)$ for such frequency band in accordance with the detected peak power. Compression unit 105 then dynamically compresses the input signal $X_L(k)$ in accordance with the adjusted gain from gain adjustor 109. Thereafter, COCB attenuation unit 113 attenuates the compression unit output to generate a left channel compressor output $Y_L(k)$. The attenuation ratio of the COCB attenuation unit 113 is determined by the peak power of a right channel compressor output $Y_R(k)$, which is detected by peak detector 119 and fed back to the COCB attenuation unit 113 via feedback path 123.

Similarly, in the right channel, peak detector 103 detects the peak power of the right channel input signal $X_R(k)$ in the frequency band for the purpose of gain adjustment. Gain adjustor 111 adjusts a signal gain of the input signal $X_R(k)$ for such frequency band in accordance with the detected peak power. Compression unit 107 then dynamically compresses the input signal $X_R(k)$ in accordance with the adjusted gain from gain adjustor 111. Thereafter, COCB attenuation unit 115 attenuates the compression unit output to generate the right channel compressor output $Y_R(k)$. The attenuation ratio of the COCB attenuation unit 115 is determined by the peak power of the left channel compressor output $Y_L(k)$, which is detected by peak detector 117 and fed back to the COCB attenuation unit 115 via feedback path 121.

As can be seen from FIG. 1, an overall gain in the left or right channel of binaural cochlear compressor 100 is the result of a combination of compression of the corresponding input signal ($X_L(k)$ or $X_R(k)$) in the ipsilateral channel (i.e., the left or right channel) combined with an efferent attenuation signal (resulting from $Y_R(k)$ or $Y_L(k)$) from the contralateral channel (i.e., the right or left channel). Both sets of signals, i.e., ($X_L(k)$ and $Y_R(k)$) and ($X_R(k)$ and $Y_L(k)$), are peak-detected to generate control signals for the purpose of gain adjustments therewith. Moreover, the ipsilateral and contralateral peak detectors would typically have different attack and release time constants.

Figure 2:
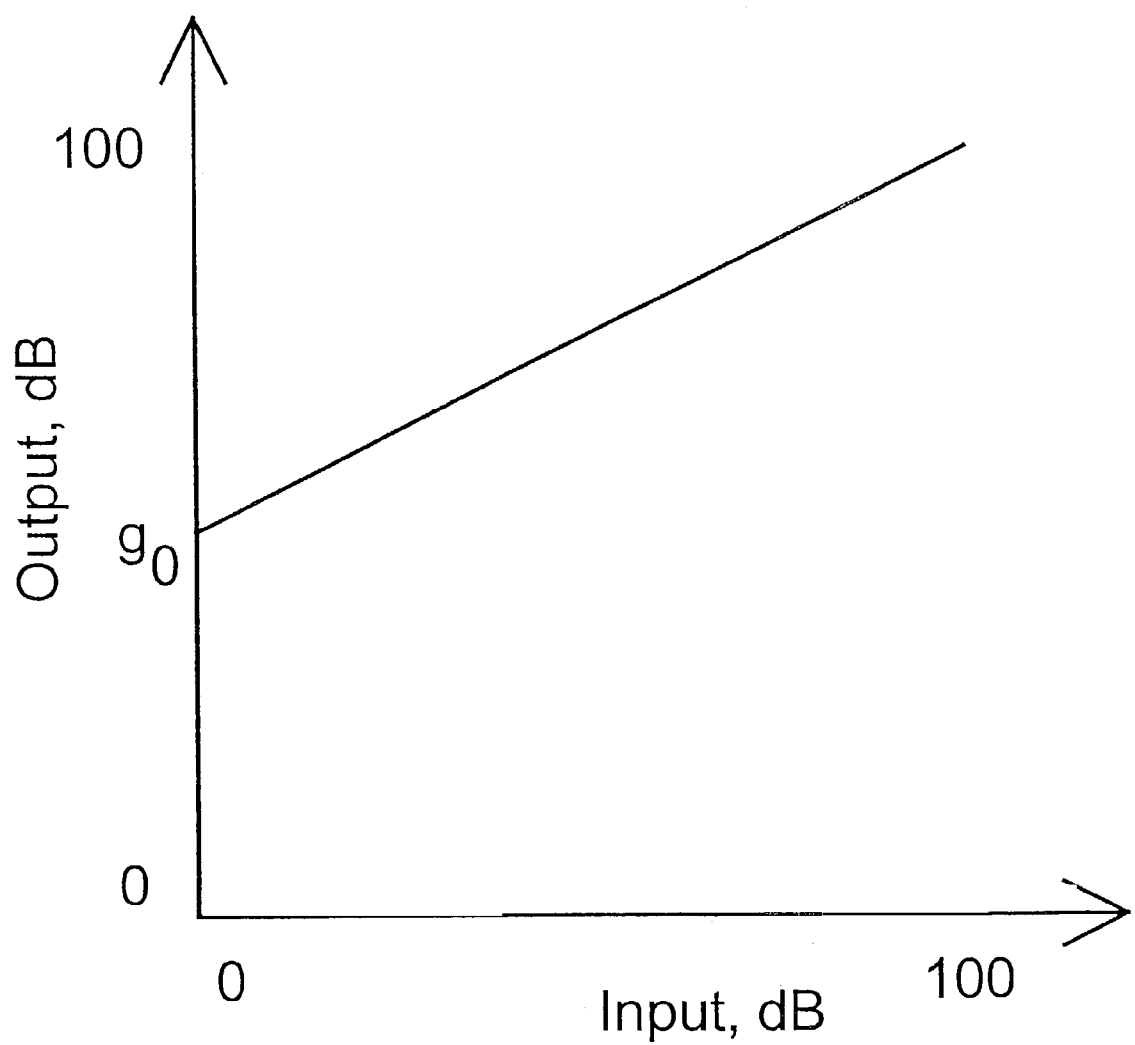
FIG. 2 illustrates an input/output function for a simplified binaural cochlear compressor.

FIG. 2 illustrates a compression rule used for the simplified signal processing system shown in FIG. 1. An input/output curve is plotted in dB, and all inputs and outputs of binaural cochlear compressor 100 are expressed in dB. According to the signal processing model shown in FIG. 2, an input of 0 dB at a channel yields an output of $g_0$ dB at that channel, and the slope of the input/output curve is the inverse of the compression ratio. For the human auditory system, many monaural measurements indicate that the offset gain $g_0$ is approximately 60 dB for sounds at the human auditory threshold. Moreover, the compression ratio typically ranges from about 1.5:1 at low frequencies to about 4:1 at high frequencies, and is about 2.5:1 in the central portion of the speech frequency region.

A frequency-domain steady-state compression behavior for each channel of binaural cochlear compressor 100 can therefore be given by $$\log|Y_L(k)| = g_0 + \frac{1}{r}\log|X_L(k)| - \alpha[\log|Y_R(k)| - g_0], \quad \text{dB} \qquad (1)$$

$$\log|Y_R(k)| = g_0 + \frac{1}{r}\log|X_R(k)| - \alpha[\log|Y_L(k)| - g_0], \quad \text{dB}$$

where k is the frequency analysis band index, r is the compression ratio, and $\alpha$ is the fraction of a compressed contralateral output that is used to control the ipsilateral COCB attenuation. Solving this set of equations (Eq. (1)) yields the compressed outputs of both channels in terms of the pair of input signals as $$\log|Y_L(k)| = g_0 + \frac{1}{r}[\log|X_L(k)| - \alpha\log|X_R(k)|]/(1-\alpha^2), \quad \text{dB} \qquad (2)$$

$$\log|Y_R(k)| = g_0 + \frac{1}{r}[\log|X_R(k)| - \alpha\log|X_L(k)|]/(1-\alpha^2), \quad \text{dB}$$

The amount of COCB inhibition effect found in the experiments indicates that a typical value of $\alpha$ for the preferred embodiment should be about 0.2 to give 20 dB of signal suppression for a 100-dB SPL input signal. For such a small value of $\alpha$, Eq. (2) can be approximated by $$\log|Y_L(k)| \cong g_0 + \frac{1}{r}[\log|X_L(k)| - \alpha\log|X_R(k)|], \quad \text{dB} \qquad (3)$$

$$\log|Y_R(k)| \cong g_0 + \frac{1}{r}[\log|X_R(k)| - \alpha\log|X_L(k)|], \quad \text{dB}$$

Eqs. (2) and (3) show that an audio system, such as the hearing aid system, using the COCB feedback model in FIG. 1 according to the preferred embodiment, can also be expressed in terms of the ipsilateral and contralateral input signals, analogous to a feed-forward compressor structure.

Assuming that the input signal level in the right channel of binaural cochlear compressor 100 is greater than the input signal level in the left channel, giving $$\log|X_R(k)| = \log|X_L(k)| + \Delta(k), \Delta(k) > 0 \text{ dB}. \qquad (4)$$

The pair of compressed outputs $Y_L(k)$ and $Y_R(k)$ given by Eq. (3) can then be expressed as $$\log|Y_L(K)| = g_0 + \frac{1-\alpha}{r}\log|X_L(k)| - \frac{\alpha}{r}\Delta(k), \quad \text{dB} \qquad (5)$$

$$\log|Y_R(k)| = g_0 + \frac{1-\alpha}{r}\log|X_L(k)| + \frac{1}{r}\Delta(k), \quad \text{dB}$$

The difference in the compressed output signal levels for the difference of $\Delta(k)$ in the log input signal levels is then $$\log|Y_R(k)| - \log|Y_L(k)| = \frac{1+\alpha}{r}\Delta(k), \quad \text{dB}. \qquad (6)$$

An absence of the COCB inhibition function would be indicated by $\alpha=0$, so a cochlear compression model without the COCB feedback would have a compressed level difference of $\Delta(k)/r$ dB. According to the preferred embodiment, the COCB emulation increases the logarithmic level difference between the right and left compressed outputs by a scale factor of $(1+\alpha)$, as shown by Eq. (6). Increasing $\alpha$ therefore increases the amount of interaural suppression provided by the COCB feedback of the binaural cochlear model. Moreover, the COCB effects are equivalent to reducing the compression ratio for interaural level differences to give an effective compression ratio of $r/(1+\alpha)$ for the difference component of the compressed outputs, $\log|Y_R(k)|-\log|Y_L(k)|$. However, the effective compression ratio for both the left and right signal levels as given by Eq. (5) is $r/(1-\alpha)$, so the COCB effects can also be interpreted as increasing the compression ratio for an average signal level of each channel. Thus, the presently described binaural cochlear model indicates that the COCB effects due to the auditory efferents increase the compression ratio for the average signal level of each channel but decrease the compression ratio for interaural level differences.

Binaural Compression Algorithms

The binaural cochlear model shown in FIG. 1 can be used as a basis of a binaural signal compression system in a pair of hearing aids. Assuming that the auditory impairment of a patient is caused primarily by OHC damage, the pair of hearing aids with the binaural compression system can be used to simulate functions of normal ears. Specifically, the feed-forward binaural cochlear compressor 100 shown in FIG. 1 provides a dynamic-range compression that would be provided by the OHC population in a normal ear, and the signal attenuation resulting from the crossed feedbacks of the compressed signal outputs provides the COCB inhibition function that is also assumed to be reduced or missing for the auditory impaired patient. In an alternative embodiment, the feed-forward binaural cochlear compressor of the hearing aid pair could be replaced by a feedback compressor design with no loss of generality.

According to the present invention, the binaural cochlear compressor of the hearing aid pair computes a desired gain as a function of input/output signal levels. The gains in the left and right channels are respectively given by $$\log[G_L(k)] = \log|Y_L(k)| - \log|X_L(k)|$$

$$\log[G_R(k)] = \log|Y_R(k)| - \log|X_R(k)|. \qquad (7)$$

Starting with the input/output relationship given in Eq. (3), the gains are then given as $$\log[G_L(K)] = g_0 + \left(\frac{1}{r}-1\right)\log|X_L(k)| - \frac{\alpha}{r}\log|X_R(k)| \qquad (8)$$

$$\log[G_R(k)] = g_0 + \left(\frac{1}{r}-1\right)\log|X_R(k)| - \frac{\alpha}{r}\log|X_L(k)|$$

The first term at the right-hand side of Eq. (8), $g_0$, is the gain provided by the binaural cochlear compressor for an input signal at 0 dB SPL. The second term, $$\left(\frac{1}{r}-1\right)\log|X_L(k)|$$

or $$\left(\frac{1}{r}-1\right)\log|X_R(k)|,$$

represents a monaural compression when the COCB effects are not present. And the last term, $$\frac{\alpha}{r}\log|X_R(k)| \text{ or } \frac{\alpha}{r}\log|X_L(k)|,$$

represents the signal suppression due to the COCB effects. As such, the binaural cochlear compressor's signal suppression depends on the compression ratio r and the amount of suppression α elected.

The compression ratio r adopted by a hearing aid is generally chosen to reflect the degree of hearing loss of an intended user, with the compression ratio r increasing as the hearing loss increases. Similarly, the amount of the COCB cross-coupling needed by the binaural cochlear compressor to simulate the COCB effects would also be expected to be proportional to the degree of hearing loss. Thus, α in Eq. (8) should be made a function of the hearing loss as well. A simple way of implementing this dependence on hearing loss is to make α a function of the compression ratio such as:

$$\alpha = a \times (r-1). \tag{9}$$

The compression ratio r in the hearing aids is typically set at $1 \leq r \leq 3$. In the case of r=1 (i.e. a compression ratio of 1:1), the person's hearing is assumed normal and no additional COCB processing would be required. Consequently, the resultant value of α is zero when r=1. A greater amount of the COCB processing needed is therefore tied to a higher compression ratio r, e.g., with α=2a resulting for r=3.

Substituting Eq. (9) into Eq. (8) for the compressor gain then gives $$\log[G_L(k)] = g_0 + \left(\frac{1}{r} - 1\right)[\log|X_L(k)| + a \cdot \log|X_R(k)|] \tag{10}$$

$$\log[G_R(k)] = g_0 + \left(\frac{1}{r} - 1\right)[\log|X_R(k)| + a \cdot \log|X_L(k)|]$$

As shown in Eq. (10), the operation of the binaural cochlear compressor is controlled by a weighted combination of signal levels of the ipsilateral and contralateral input signals, $X_L(k)$ and $X_R(k)$. This concept can be generalized to an arbitrary compressor input/output function, with the weighted combination of the ipsilateral and contralateral input signals substituted for the ipsilateral signals previously used to control independent compressors at each ear. Based on a system given by Eq. (10), FIG. 3 accordingly shows a simplified block diagram of the feed-forward binaural cochlear compressor 300 according to another preferred embodiment of the present invention. Alternatively, an equivalent feedback compressor configuration can also be derived.

Figure 3:
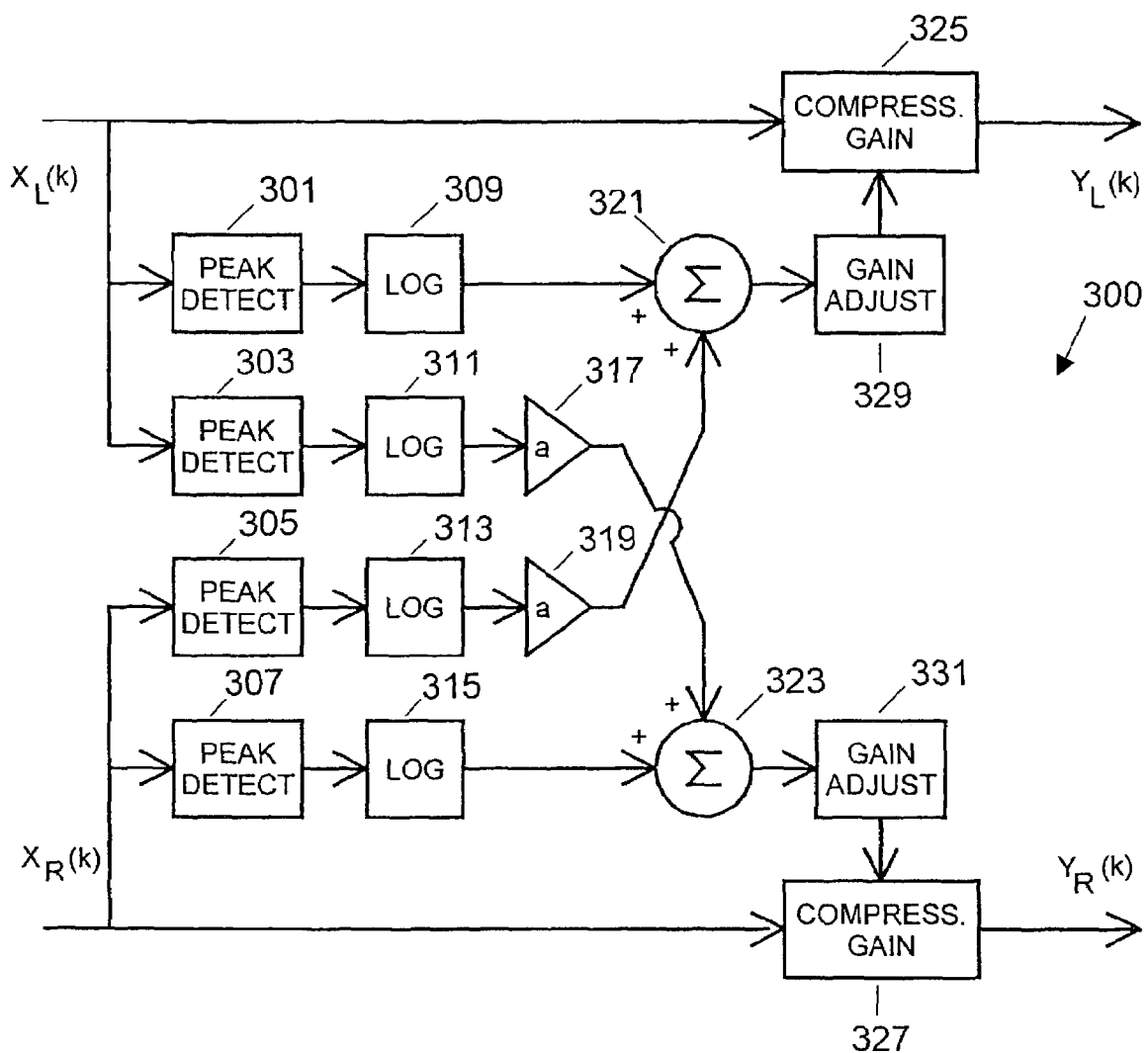
FIG. 3 illustrates a binaural cochlear compressor using the input signals to control a compressor gain.

As shown in FIG. 3, the left channel input signal $X_L(k)$ is inputted into compression unit 325, peak detector 301, and peak detector 303. Logarithmic units 309, 311 respectively receive outputs from peak detectors 301, 303 to convert the detected peak values of the input signal $X_L(K)$ into logarithms. Multiplier 317 multiplies the output from the logarithmic unit 311 by a factor of a. Correspondingly, the right channel input signal $X_R(k)$ is inputted into compression unit 327, peak detector 305, and peak detector 307. Logarithmic units 313, 315 respectively receive outputs from peak detectors 305, 307 to convert the detected peak values of the input signal $X_R(K)$ into logarithms. Multiplier 319 multiplies the output from the logarithmic unit 313 by a factor of a. Outputs from multiplier 319 and logarithmic unit 309 are summed by adder 321 and outputs from multiplier 317 and logarithmic unit 315 are summed by adder 323. Subsequently, gain adjustors 329, 331 receive outputs from adders 321, 323 to adjust compression gains of the binaural cochlear compressor 300. The compression units 325, 327 then dynamically compress the input signals $X_L(k)$, $X_R(k)$ in accordance with the adjusted gains from gain adjustors 329, 331 to produce the left and right channel compressed outputs $Y_L(K)$ and $Y_R(k)$.

An implementation concern of the binaural cochlear compressor 100, 300, or the like, is that the ipsilateral and contralateral control signals used therein may work best with different time constants. A solution would be to use two sets of peak detectors for the binaural cochlear compressor as shown in FIGS. 1 and 3, respectively. Peak detectors having a fast attack time and a syllabic release time would be appropriate for generating the ipsilateral control signals (e.g., the second terms in Eqs. (8) and (10)) from the hearing aid input signals, as is now done in a monaural instrument. The contralateral control signals (e.g., the third terms in Eqs. (8) and (10)) could be generated from the input signals using attack and release time constants of about 60 msec, as indicated by physiological data from the experimental measurements.

The system given by Eq. (10) will reduce overall gain of the hearing aid pair when a signal is present at the contralateral ear. Thus, binaural compression provided by the present binaural cochlear compressor, when compared to dual monaural hearing aids, is equivalent to an increase in the effective compression ratio. The change in the compression ratio could interfere with rules currently used to fit conventional hearing aids, especially since the conventional fitting rules may include an ad hoc adjustment of the compression ratio when fitting a pair of independent monaural hearing aids, as opposed to fit a single hearing aid instrument. Such problem for the binaural cochlear compression system with the COCB processing can be corrected by adjusting for the presence of the ipsilateral and contralateral control signals for each compression unit therein. Accordingly, a modified binaural compression system of yet another preferred embodiment can be given by $$\log[G_L(k)] = g_0 + \left(\frac{1}{r} - 1\right)[\log|X_L(k)| + a \cdot \log|X_R(k)|]/(1+a) \tag{11}$$

$$\log[G_R(k)] = g_0 + \left(\frac{1}{r} - 1\right)[\log|X_R(k)| + a \cdot \log|X_L(k)|]/(1+a)$$

This modified binaural compression system would still be described by the block diagram of FIG. 3, and the weighted combination of the ipsilateral and contralateral input signals can be used to control an arbitrary compressor input/output function.

Simplified Algorithms

Figure 4:
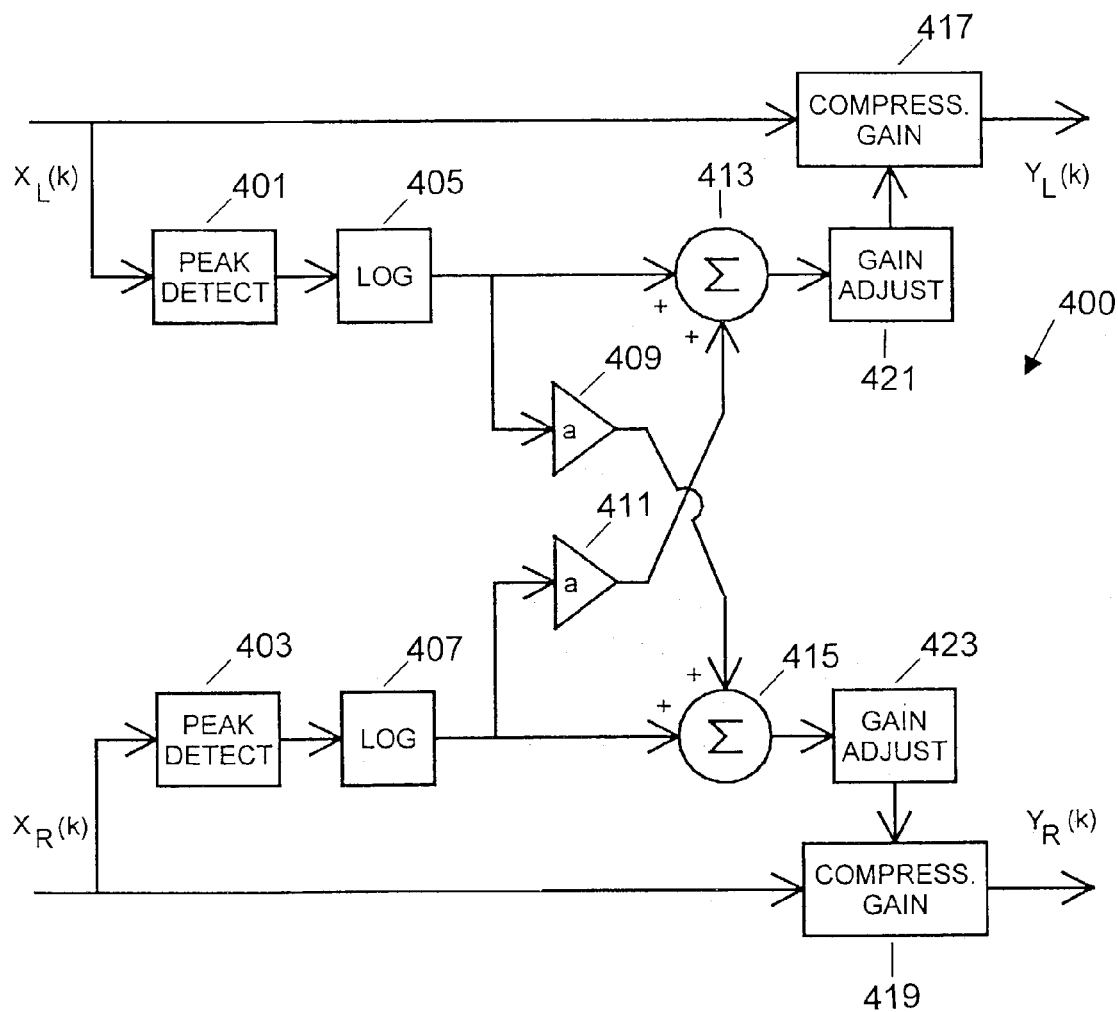
FIG. 4 illustrates a binaural cochlear compressor using the input signals with a single peak detector per channel to control the compressor gain.
Figure 5:
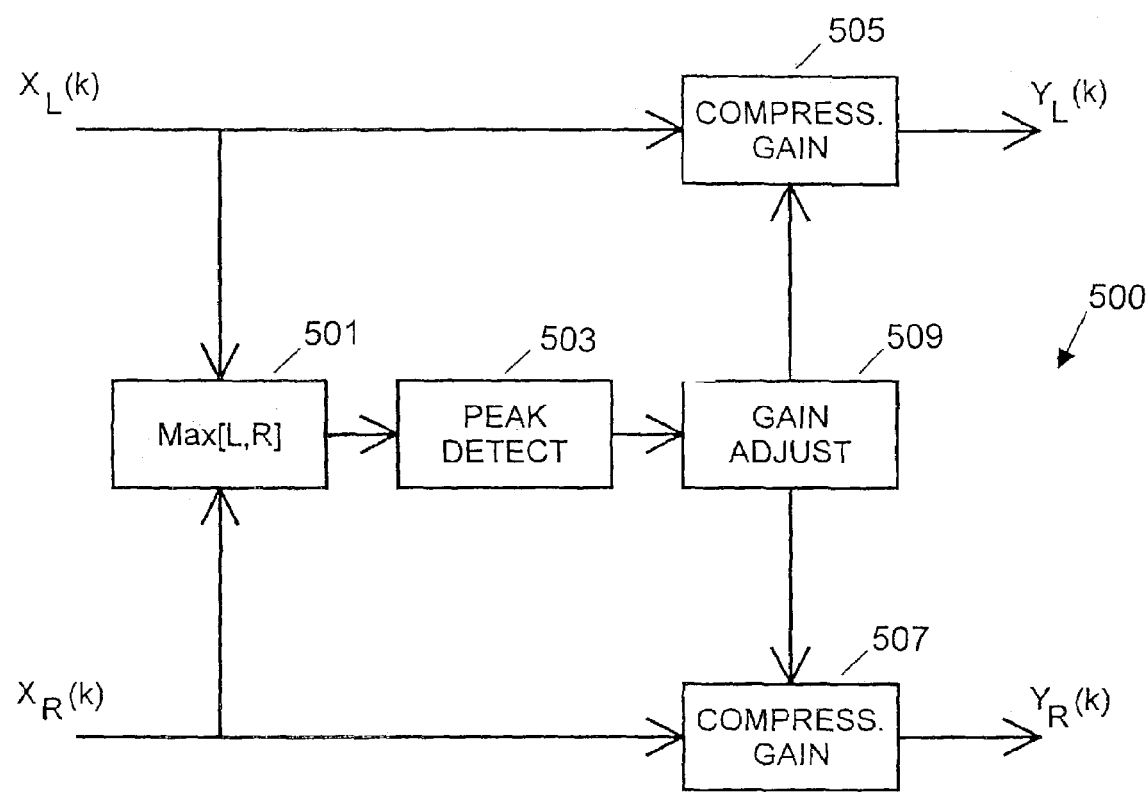
FIG. 5 illustrates a binaural cochlear compressor using the maximum of the left and right input signals to control the compression gain.

The binaural cochlear compressors shown in FIGS. 1 and 3 respectively require two sets of peak detectors to simulate the assumed COCB temporal behavior. Alternatively, other preferred embodiments with simpler binaural compression systems having a reduced number of peak detectors can be developed, as shown in FIGS. 4 and 5. FIG. 4 shows a signal processing model of binaural cochlear compressor 400 using the input signals with a signal peak detector per channel to control gains of the compression unit at each channel. In FIG. 4, peak detector 401 and compression unit 417 respectively receive the left channel input signal $X_L(k)$, and peak detector 403 and compression unit 419 respectively receive right channel input signal $X_R(k)$. Logarithmic units 405, 407 receive outputs from peak detectors 401, 403, respectively, to convert the detected peak values of the input signals $XL(k)$ and $X_R(K)$ into logarithms. Multipliers 409, 411 then multiply the outputs of the logarithmic units 405, 407, respectively, by a factor a to produce the contralateral control signals. Adder 413 adds the output from logarithmic unit 405 with the output from multiplier 411 (i.e., adds the ipsilateral control signal with the contralateral control signal for the left channel). Similarly, adder 415 adds the output from logarithmic unit 407 with the output from multiplier 409. Subsequently, gain adjustors 421, 423 adjust gains from the outputs of adders 413, 415, respectively, and output the adjusted gains to compression units 417, 419 to produce left and right channel compressed outputs $Y_L(k)$ and $Y_R(k)$.

As shown in FIG. 4, the binaural cochlear compressor 400 uses a same peak detector 401 or 403 at each signal channel to produce the ipsilateral and contralateral control signals respectively for the left and right channels. Consequently, the binaural suppression of such a binaural compressor has the same temporal behavior as the monaural compression. The computational burden is, however, reduced, as compared with the binaural compression system shown in FIG. 3, since only two and not four peak detectors are needed. As for the binaural compression systems shown in FIGS. 1 and 3, the weighted combination of the ipsilateral and contralateral input signals can be used to control an arbitrary compressor input/output function.

In yet another preferred embodiment, an even simpler binaural compression system can be developed, as shown in FIG. 5. In FIG. 5, the binaural compression system includes a simplified binaural cochlear compressor 500 with maximizing unit 501, peak detector 503, and gain adjustor 509 contained therein. The left channel input signal $X_L(k)$ is received by compression unit 505 and maximizing unit 501, and the right channel input signal $X_R(k)$ is received by compression unit 507 and maximizing unit 501. Left and right channel signals outputted from the maximizing unit 501 are detected by peak detector 503 and then adjusted by gain adjustor 509 before they are inputted into compression units 505, 507 to produce the left and right channel compressed outputs $Y_L(k)$ and $Y_R(k)$. As shown in FIG. 5, such a binaural compression system uses the peak-detected maximums of the left and right channel input signals to simultaneously control both the left and right channel compression units 505, 507. The left and right channels of the binaural cochlear compressor 500 have the same gain at any given time. As a result, the computational burden for the COCB algorithm of binaural cochlear compressor 500 is lower than for other COCB algorithms, including an algorithm for the system described in FIG. 4. The maximum power in each frequency band can be computed from a block magnitude power spectra, with the maximum signal then peak detected and this single signal used to adjust an identical compressor gain function in both the left and right channels of the binaural cochlear compressor 500. Thus, the algorithm of FIG. 5 requires just a single peak detector, and the peak-detected signal can be used to control any desired compressor input/output function.

Because the gain for the compression system of FIG. 5 is controlled by a more-intense signal, a less-intense signal is suppressed in a manner similar to that provided by the other previously mentioned COCB models. Again, assuming that the input signal level in the right channel is greater than that in the left channel by $\Delta(k)$ dB, as given by Eq. (4). The binaural compressor gains for both channels will then be the gain determined for the right channel input signal. The compressed output signal levels are then given as $$\log|Y_L(k)| = \log[G_R(k)] + \log|X_L(k)|, \text{dB}$$

$$\log|Y_R(k)| = \log[G_R(k)] + \log|X_L(k)| + \Delta(k), \text{dB}. \quad (12)$$

The difference in the compressed output signal levels for the difference of $\Delta(k)$ in the log input signal levels is then $$\log|Y_R(k)| - \log Y_L(k)| = \Delta(k), \text{dB} \quad (13)$$

because the two channels have the same instantaneous gain. Thus, using the maximum of the right and left peak-detected input signals to control binaural cochlear compressor 500 gives uncompressed output level differences even though the average signal levels are still compressed for both channels. The uncompressed differences result in suppression of the weaker signal by the stronger signal, and the amount of suppression will in general be greater than that of Eq. (6) for the binaural COCB model or that provided by the binaural compressor of Eq. (11).

Simulation Results

Four binaural signal processing systems were simulated in MATLAB. The systems were (1) an independent monaural compression system in the two ears using 5-msec attack and 70-msec release times, (2) a COCB compressor using 5-msec attack and 70-msec release time constants for the ipsilateral peak detection and 60-msec attack and release time constants for the contralateral COCB peak detection as shown in FIG. 3, (3) a COCB compressor using the 5-msec attack and 70-msec release time constants for both the ipsilateral compression and contralateral COCB peak detection as shown in FIG. 4, and (4) a COCB compressor using the maximum of the left and right input signals to control the compression gain for both ears as shown in FIG. 5, again with the 5-msec attack and 70-msec release time constants. All of the signal processing systems use a compression rule having a lower kneepoint at 45 dB SPL, an upper kneepoint at 100 dB SPL, and a 2:1 compression ratio between the kneepoints. Each compressor has a linear gain below the lower kneepoint and a compression limit above the upper kneepoint. In addition, each of the COCB cross-linked compressors uses a contralateral linkage factor of a=0.2 for the combined ipsilateral and contralateral control signals, as indicated in Eq. (11).

The test signal used to test these systems consists of two signals. In particular, a desired signal is chosen from a segment of the "Rainbow Passage" read by a male talker and presented at an azimuth of 90 degree to the right of a simulated head at a RMS level of 70 dB SPL. An interfering signal is chosen as a speech-shaped noise presented at an azimuth of 90 degree to the left of the head at a RMS level of 60 dB SPL. The sampling rate of the test is 16 kHz. The frequency dependent interaural time and level differences are simulated using a conventional spherical head model developed for binaural sound synthesis. The head model should provide realistic signal leakage from one side of the head to the other, and the left and right ear input signals are similar to those that would be obtained in free-field testing of a binaural behind-the-ear (BTE) system in an anechoic environment.

Figure 6:
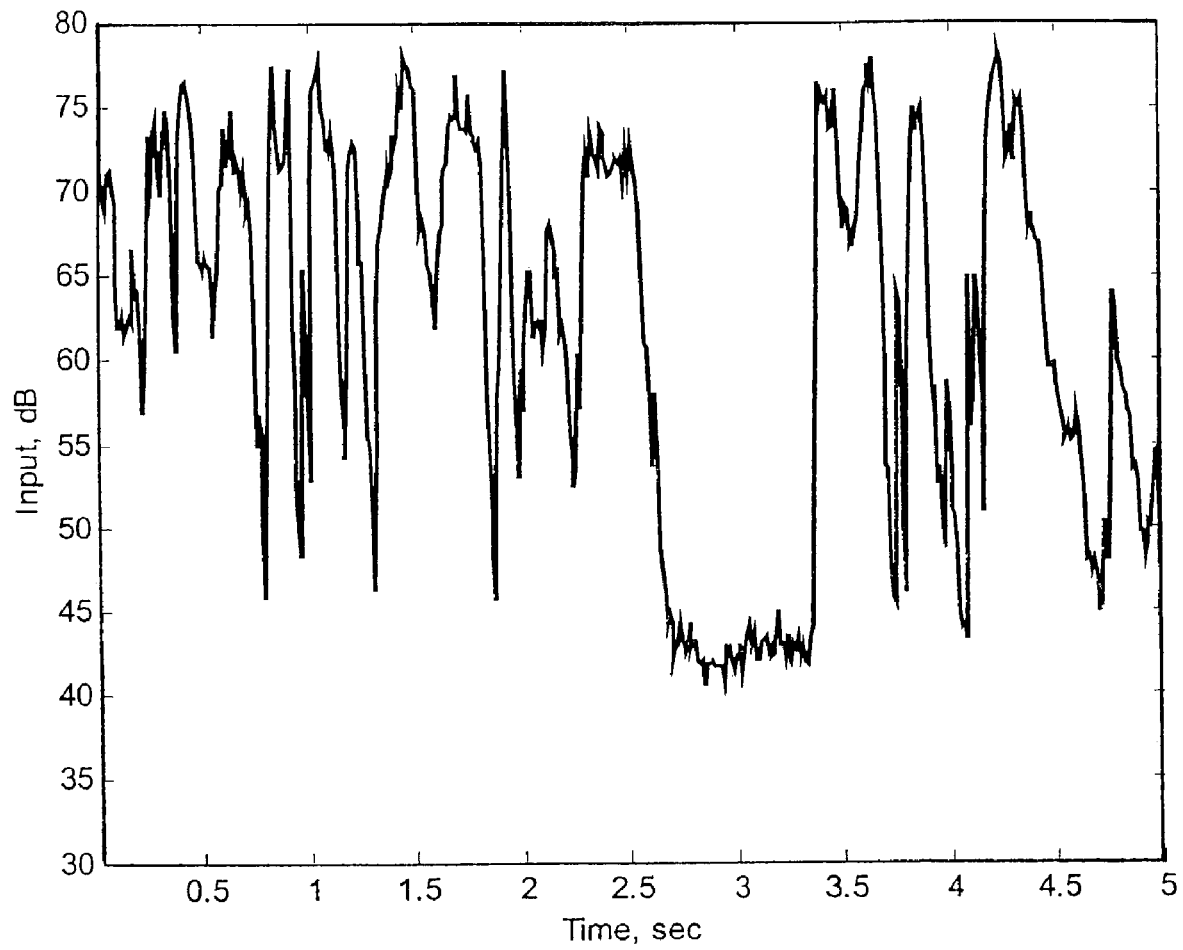
FIG. 6 illustrates an envelope of the speech signal presented to a simulated head from the direction of the right ear.

The evaluation criterion for the present simulation is an amount of suppression of the left-ear noise signal caused by the right-ear speech signal. An envelope of the input speech signal is plotted in FIG. 6. The reference condition of the simulation is the system providing independent monaural compression for each ear, i.e., system (1). The difference in compressed output signal envelopes between the independent monaural processing and the linked binaural COCB processing for the left ear indicates the amount of noise suppression that would be expected in practice. The signal envelopes are computed by calculating the RMS signal levels in non-overlapping blocks of 10 msec and converting to dB SPL.

Figure 7:
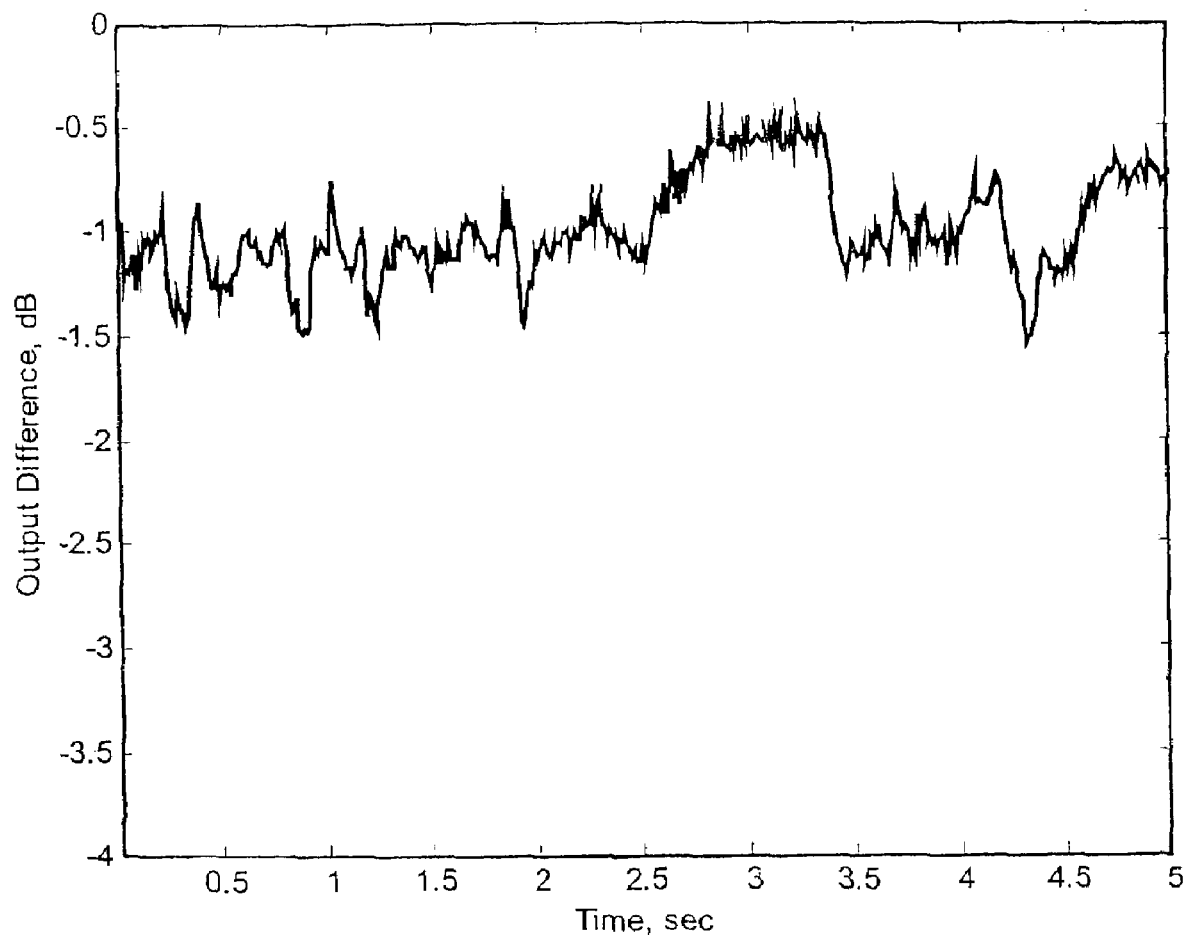
FIG. 7 illustrates the difference in the left-channel output signal envelopes between the COCB cross-linked compressor shown in FIG. 3 using separate ipsilateral and contralateral time constants and an independent monaural compression.

The left-ear envelope difference for the COCB compressor using 5-msec attack and 70-msec release time constants for the ipsilateral peak detection and 60-msec attack and release time constants for the contralateral COCB peak detection is shown in FIG. 7. During most of the speech, the binaural COCB compressor provides about 1.25 dB of suppression, as shown in FIG. 7. A pause in the speech occurs between 2.6 and 3.4 sec, during which the noise signal is more intense than the speech signal. Accordingly, during this pause period, the signal suppression is reduced to about 0.5 dB. The 60-msec time constant used for the contralateral signal detection results in relatively smooth suppression as a function of time, but the difference between the ipsilateral and contralatral detection time constants causes a difference in the detected peak levels, so there is some residual suppression even during the speech pause period.

Figure 8:
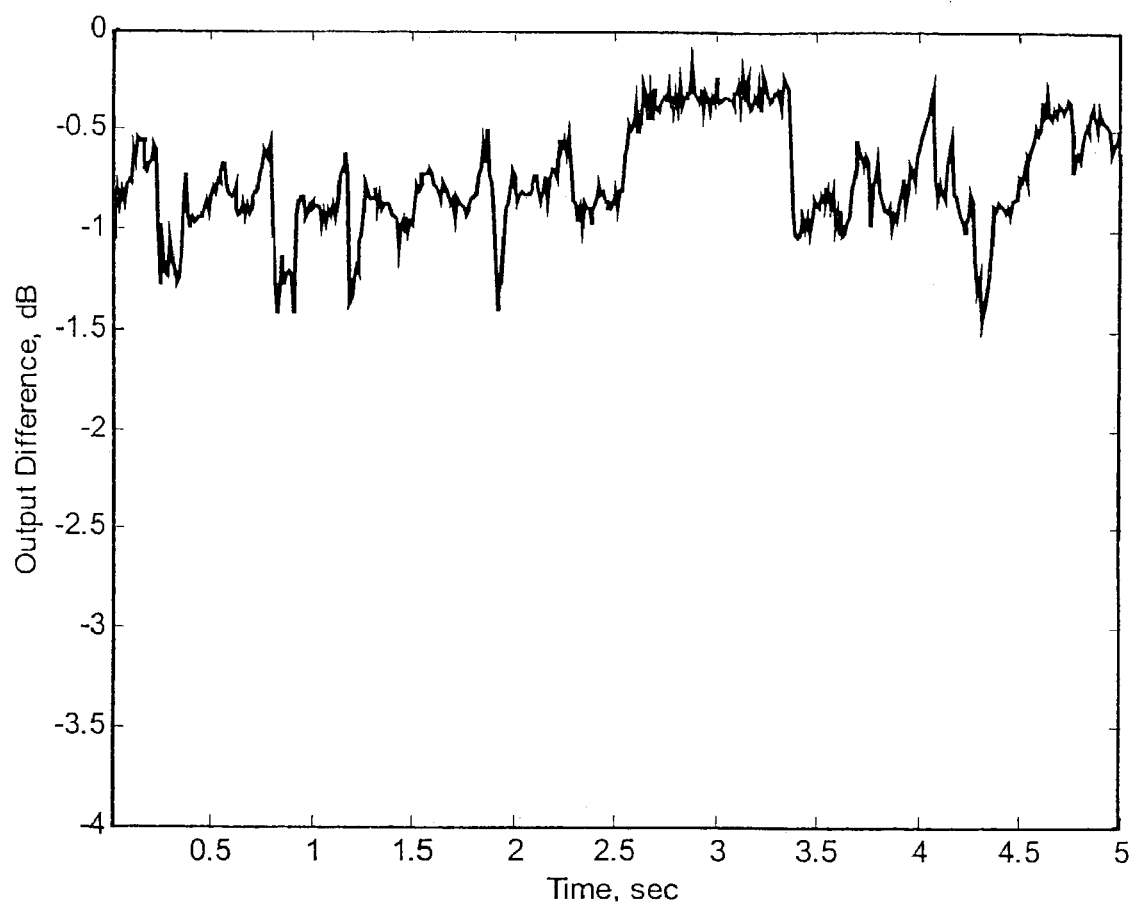
FIG. 8 illustrates the difference in the left-channel output signal envelopes between the COCB cross-linked compressor shown in FIG. 4 using the same ipsilateral and contralateral time constants and the independent monaural compression.

The left-ear envelope difference for the COCB compressor using the 5-msec attack and 70-msec release time constants for both the ipsilateral compression and the contralateral COCB peak detection is shown in FIG. 8. The basic behavior of the signal suppression when using the same peak detector for the ipsilateral and contralateral signals is quite similar to that observed when different time constants are used. The entire suppression curve has been elevated by about 0.25 dB, as compared to FIG. 7, and the suppression that occurs at speech peaks is somewhat more pronounced.

Figure 9:
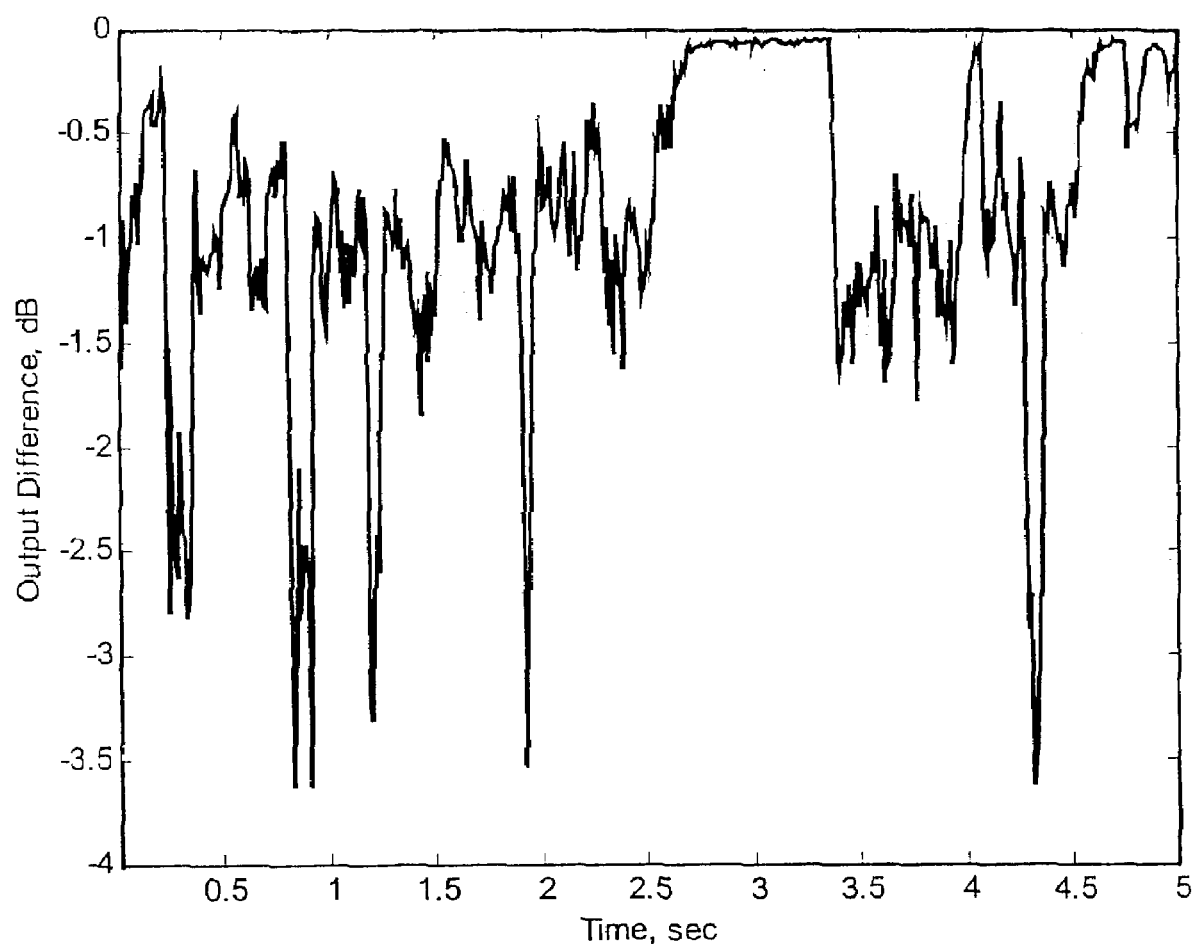
FIG. 9 illustrates the difference in the left-channel output signal envelopes between the COCB cross-linked compressor shown in FIG. 5 using the maximum of the left and right channel signals and the independent monaural compression.

The left-ear envelope difference for the compressor using the maximum of the left and right input signals to control the compression gain for both ears is shown in FIG. 9. The use of the detected signal peak results in much stronger suppression behavior for such binaural COCB compressor. The average suppression is about 1 dB, which is quite similar to that observed for other COCB systems, but this COCB compressor causes short-term suppression effects of up to 3.5 dB for the speech peaks. Also, there is essentially no suppression observed for the pause period in the speech between 2.6 and 3.4 msec where the noise signal is the more intense of the inputs at the two ears. The modulation of the left ear noise signal by the speech at the right ear is much stronger for this system than for the previous two COCB systems.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A binaural hearing aid system comprising:
    a first hearing aid having a first channel;
    a second hearing aid having a second channel;
    a first peak detector in the first hearing aid for detecting an occurrence of a signal peak of a first channel input signal;
    a second peak detector in the second hearing aid for detecting an occurrence of a signal peak of a second channel input signal;
    a first gain adjustor in the first hearing aid, coupled to said first peak detector, for adjusting a first channel gain control signal based at least in part on the detected signal peak of the first channel input signal;
    a second gain adjustor in the second hearing aid, coupled to said second peak detector, for adjusting a second channel gain control signal based at least in part on the detected signal peak of the second channel input signal;
    a first channel compressing unit in the first hearing aid, said first channel compressing unit receiving the first channel input signal for generating a first channel dynamic range compressed output in accordance with the first channel gain control signal; and
    a second channel compressing unit in the second hearing aid, said second compressing unit receiving the second channel input signal for generating a second channel dynamic range compressed output in accordance with the second channel gain control signal;
    wherein the first channel dynamic range compressed output of the first channel compressing unit is for causing a cross-suppression effect in an output signal of the second channel, and the second channel dynamic range compressed output of the second channel compressing unit is for causing a cross-suppression effect in an output signal of the first channel.

2. The binaural hearing aid system of claim 1, further comprising a maximum determining means for determining first and second channel maximum signals of the first and second channel input signals, respectively, said first and second peak detectors configured for detecting signal peaks of the first and second channel maximum signals.

3. The binaural hearing aid system of claim 1, wherein the first and second channel gain control signals are identical.

4. The binaural hearing aid system of claim 1, wherein the first and second channel gain control signals are weighted combination of peak-detected signals derived from the first and second channel input signals.

5. The binaural hearing aid system of claim 1, wherein said first and second channel compressing units respectively comprise a plurality of frequency compressing regions configured to compress a corresponding plurality of frequency bands of the first and second channel input signals, the first and second channel gain control signals respectively being weighted combination of peak-detected signals derived from the first and second channel input signals.

6. The binaural hearing aid system of claim 5, wherein the weighted combination of the peak-detected signals have different time constants.

7. The binaural hearing aid system of claim 5, wherein the weighted combination of the peak-detected signals have same time constants.

8. The binaural hearing aid system of claim 1, further comprising:
    a first channel logarithmic converter coupled to said first peak detector, said first channel logarithmic converter configured to convert the detected signal peak of the first channel input signal into a logarithm; and
    a second channel logarithm converter coupled to said second peak detector, said second channel logarithmic converter configured to convert the detected signal peak of the second channel input signal into a logarithm.

9. The binaural hearing aid system of claim 8, further comprising:
    a first channel multiplier coupled to said first channel logarithmic converter, said first channel multiplier configured to multiply an output of said first channel logarithmic converter by a predetermined factor;
    a second channel multiplier coupled to said second channel logarithmic converter, said second channel multiplier configured to multiply an output of said second channel logarithmic converter by the predetermined factor;
    a first adder, coupled to said first channel logarithmic converter and said second channel multiplier, for summing outputs respectively thereof; and a second adder, coupled to said second channel logarithmic converter and said first channel multiplier, for summing outputs respectively thereof, wherein the first and second gain adjustors are configured to respectively receive outputs of said first and second adder to adjust the first and second channel gain control signals.

10. The binaural hearing aid system of claim 9, wherein said first peak detector comprises first and second peak detector units for respectively detecting signal peaks of the first channel input signal, said first channel logarithmic converter comprises first and second logarithmic units for respectively converting the detected signal peaks of said first and second peak detector units into logarithms, said second peak detector comprises third and fourth peak detector units for respectively detecting signal peaks of the second channel input signal, and said second channel logarithmic converter comprises third and fourth logarithmic units for respectively converting the detected signal peaks of said third and fourth peak detector units into logarithms, said first channel multiplier being coupled to said second logarithmic unit to multiply an output of said second logarithmic unit by the predetermined factor, said second channel multiplier being coupled to said third logarithmic unit to multiply an output of said third logarithmic unit by the predetermined factor, said first adder being coupled to said first logarithmic unit and said second channel multiplier for summing outputs respectively thereof, and said second adder being coupled to said fourth logarithmic unit and said first channel multiplier for summing outputs respectively thereof.

11. The binaural hearing aid system of claim 1, further comprising:

a first channel attenuator located in the first hearing aid and coupled to said first channel compressing unit, said first channel attenuator attenuating an output of said first channel compressing unit and generating the first channel dynamic range compressed output;

a second channel attenuator located in the second hearing aid and coupled to said second channel compressing unit, said second channel attenuator attenuating an output of said second channel compressing unit and generating the second channel dynamic range compressed output;

a first feedback peak detector located in the first hearing aid and coupled to said first and second channel attenuators, said first feedback peak detector detecting a signal peak of the first channel dynamic range compressed output; and a second feedback peak detector located in the second hearing aid and coupled to said first and second channel attenuators, said second feedback peak detector detecting a signal peak of the second channel dynamic range compressed output, wherein said first and second channel attenuators respectively attenuate outputs of said first and second channel compressing units in accordance with the detected peaks of the second and first channel dynamic range compressed outputs.

12. The binaural hearing aid system of claim 1, wherein said first and second channel compressing units are configured to emulate COCB effects performed by a healthy human auditory system.

13. The binaural hearing aid system of claim 1, in which the first gain adjustor is configured to adjust the first channel gain control signal further based at least in part on the detected signal peak of the second channel input signal.

14. The binaural hearing aid system of claim 1, in which the second gain adjustor is configured to adjust the second channel gain control signal further based at least in part on the detected signal peak of the first channel input signal.

15. The binaural hearing aid system of claim 1, wherein the first hearing aid is configured to be worn at a left ear, and the second hearing aid is configured to be worn at a right ear.

16. The binaural hearing aid system of claim 1, wherein the first and second channel dynamic range compressed outputs are for causing the respective cross-suppression effects at different times.

17. A binaural hearing aid system, comprising:

a plurality of signal channels for receiving respective input signals and outputting respective output signals, the input signals having a first channel input signal and a second channel input signal, the plurality of signal channels having a first signal channel and a second signal channel for processing the input signals received at left ear and right ear respectively, wherein the first signal channel and the second signal channel of the plurality of signal channels are cross-coupled to each other so that the first channel input signal causes a first cross-suppression effect in generating a second channel dynamic range compressed output signal by the second signal channel, and the second channel input signal causes a second cross-suppression effect in generating a first channel dynamic range compressed output signal by the first signal channel, wherein said first signal channel comprises a first dynamic range compressor for receiving the first channel input signal and generating the first channel dynamic range compressed output signal in accordance with a first channel control signal, and said second signal channel comprises a second dynamic range compressor for receiving the second channel input signal and generating the second channel dynamic range compressed output signal in accordance with a second channel control signal;

a peak detector for detecting respective signal peaks of the first and second input signals; and a gain adjustor, coupled to said first and second dynamic range compressor, for adjusting the first and second channel control signals, wherein the first and second channel control signals are respectively weighted combination of peak-detected signals derived from the first and second channel input signals.

18. The binaural hearing aid system of claim 17, wherein the first and second channel control signals are respectively weighted combination of signals derived from the first and second channel input signals.

19. The binaural hearing aid system of claim 17, wherein said first and second dynamic range compressors respectively comprise a plurality of frequency compressing regions adapted to compress a corresponding plurality of frequency bands of the first and second channel input signals, the first and second channel control signals respectively being weighted combination of signals derived from the first and second channel input signals.

20. The binaural hearing aid system of claim 17, wherein the weighted combination of the peak-detected signals have different time constants.

21. The binaural hearing aid system of claim 17, wherein the weighted combination of the peak-detected signals have same time constants.

22. The binaural hearing aid system of claim 17, further comprising a maximum determining means for determining first and second channel maximum signals respectively of the first and second channel input signals, said peak detector being coupled to said maximum determining means to detect signal peaks of the first and second channel maximum signals.

23. The binaural hearing aid system of claim 17, wherein the first and second channel control signals are identical.

24. The binaural hearing aid system of claim 17, wherein said peak detector comprises first and second channel peak detectors respectively detecting the signal peaks of the first and second channel input signals, and said gain adjustor comprises first and second channel gain adjustors respectively coupled to said first and second channel peak detectors for adjusting the first and second channel control signals in accordance with the detected signal peaks of the first and second channel input signals, said first channel peak detector and said first channel gain adjustor being located in said first signal channel, said second channel peak detector and said second channel gain adjustor being located in said second signal channel.

25. The binaural hearing aid system of claim 24, further comprising:
a first channel logarithmic converter located in said first signal channel and coupled to said first channel peak detector, said first channel logarithmic converter converting the detected signal peak of the first channel input signal into a logarithm;
a second channel logarithmic converter located in said second signal channel and coupled to said second channel peak detector, said second channel logarithmic converter converting the detected signal peak of the second channel input signal into a logarithm;
a first channel multiplier located in said first signal channel and coupled to said first channel logarithmic converter, said first channel multiplier multiplying an output of said first channel logarithmic converter by a predetermined factor;
a second channel multiplier located in said second signal channel and coupled to said second channel logarithmic converter, said second channel multiplier multiplying an output of said second channel logarithmic converter by the predetermined factor;
a first adder located in said first signal channel, said first adder being coupled to said first channel logarithmic converter and said second channel multiplier to sum outputs respectively thereof; and
a second adder located in said second signal channel, said second adder being coupled to said second channel logarithmic converter and said first channel multiplier to sum outputs respectively thereof, wherein
said first and second channel gain adjustors respectively receive outputs of said first and second adders to adjust the first and second channel control signals.

26. The binaural hearing aid system of claim 25, wherein said first channel peak detector comprises first and second peak detecting units respectively detecting signal peaks of the first channel input signal, said first channel logarithmic converter comprises first and second logarithmic units respectively converting the detected signal peaks of said first and second peak detecting units into logarithms, said second channel peak detector comprises third and fourth peak detecting units respectively detecting signal peaks of the second channel input signal, and said second channel logarithmic converter comprises third and fourth logarithmic units respectively converting the detected signal peaks of said third and fourth peak detecting units into logarithms, said first channel multiplier being coupled to said second logarithmic unit to multiply an output of said second logarithmic unit by the predetermined factor,
said second channel multiplier being coupled to said third logarithmic unit to multiply an output of said third logarithmic unit by the predetermined factor,
said first adder being coupled to said first logarithmic unit and said second channel multiplier to sum outputs respectively thereof, and
said second adder being coupled to said fourth logarithmic unit and said first channel multiplier to sum outputs respectively thereof.

27. The binaural hearing aid system of claim 17, further comprising:
a first channel attenuator located in said first signal channel and coupled to said first dynamic range compressor, said first channel attenuator attenuating an output of said first dynamic range compressor to generate the first channel dynamic range compressed output signal;
a second channel attenuator located in said second signal channel and coupled to said second dynamic range compressor, said second channel attenuator attenuating an output of said second dynamic range compressor to generate the second channel dynamic range compressed output signal;
a first feedback peak detector coupled to said first and second channel attenuators, said first feedback peak detector detecting a signal peak of the first channel output signal; and
a second feedback peak detector coupled to said first and second channel attenuators, said second feedback peak detector detecting a signal peak of the second channel output signal,
wherein said first and second channel attenuators respectively attenuate the outputs of said first and second dynamic range compressors in accordance with the detected peaks of the second and first channel output signals.

28. The binaural hearing aid system of claim 17, wherein said first and second channels are configured to emulate COCB effects performed by a healthy human auditory system.

29. The binaural hearing aid system of claim 17, wherein one of the cross-suppression effects comprises, at least in part, an emulation of an olivocochlear bundle effect of a healthy human auditory system.

30. The binaural hearing aid system of claim 17, wherein the first signal channel is in a first hearing aid, and the second signal channel is in a second hearing aid.

31. A method for processing signals in a binaural hearing aid system comprising a first and a second hearing aid, the method comprising:
receiving a first channel input signal by a first channel dynamic range compressing unit of the first hearing aid;
receiving a second channel input signal by a second channel dynamic range compressing unit of the second hearing aid;
detecting signal peaks respectively of the first and second channel input signals;
determining first and second channel gain control signals, each of the first and second channel gain control signals being weighted combination of signals derived from both the first and second channel input signals;
adjusting the first channel gain control signal based on the detected signal peak of the first channel input signal;

adjusting the second channel gain control signal based on the detected signal peak of the second channel input signal;

generating a first channel dynamic range compressed output signal in order to compensate for hearing impairment by performing dynamic range compression on the first channel input signal using the first channel dynamic range compressing unit in accordance with the adjusted first channel gain control signal; and generating a second channel dynamic range compressed output signal in order to compensate for the hearing impairment by performing dynamic range compression on the second channel input signal using the second channel dynamic range compressing unit in accordance with the adjusted second channel gain control signal;

wherein the second channel dynamic range compressed output is for causing a cross-suppression effect in an output signal of a first channel, and the first channel dynamic range compressed output is for causing a cross-suppression effect in an output signal of a second channel.

32. The method according to claim 31, prior to the step of detecting signal peaks, further comprising the step of determining first and second channel maximum signals respectively of the first and second channel input signals.

33. The method according to claim 31, wherein the act of determining the first and second channel gain control signals comprises:

converting the detected signal peaks of the first and second channel input signals respectively into first and second channel logarithms;

multiplying the first and second channel logarithms respectively by a predetermined factor;

adding the first channel logarithm with the second channel logarithm multiplied by the predetermined factor; and adding the second channel logarithm with the first channel logarithm multiplied by the predetermined factor.

34. The method of claim 31, wherein the first hearing aid is configured to be worn at a left ear, and the second hearing aid is configured to be worn at a right ear.

35. The method of claim 31, wherein the cross-suppression effects in the output signals of the respective first and second channels occur at different times.

36. A method for processing signals in a binaural hearing aid system comprising a first and second hearing aid, the method comprising the acts of:

receiving a first channel input signal by a first channel dynamic range compression unit of the first hearing aid;

receiving a second channel input signal by a second channel dynamic range compressing unit of the second hearing aid;

determining each of first and second channel gain control signals in accordance with both the first channel input signal and the second channel input signal;

adjusting the first and second channel gain control signals;

generating a first channel dynamic range compressed signal by performing dynamic range compression on the first channel input signals using the first channel dynamic range compression unit in accordance with the adjusted first channel gain control signal;

generating a second channel dynamic range compressed signal by performing dynamic range compression on the second channel input signal using the second channel dynamic range compressing unit in accordance with the adjusted second channel gain control signal;

generating a first channel output signal by attenuating the first channel dynamic range compressed signal using a first channel attenuator;

generating a second channel output signal by attenuating the second channel dynamic range compressed signal using a second channel attenuator;

detecting a signal peak of the first channel output signal;

detecting a signal peak of the second channel output signal;

controlling attenuating factor of the first channel attenuator in accordance with the detected signal peak of the second channel output signal, thereby generating the first channel output signal in order to compensate for hearing impairment; and controlling attenuating factor of the second channel attenuator in accordance with the detected signal peak of the first channel output signal, thereby generating the second channel output signal in order to compensate for the hearing impairment.

37. The method of claim 36, wherein the first hearing aid is configured to be worn at a left ear, and the second hearing aid is configured to be worn at a right ear.

38. A binaural hearing aid system, comprising:

a first hearing aid having a first signal channel for receiving a first channel input signal and for providing a first channel compressed output signal having a compressed dynamic range;

a second hearing aid having a second signal channel for receiving a second channel input signal and for providing a second channel output signal having a compressed dynamic range;

a first peak detector in the first hearing aid for detecting an occurrence of a signal peak of the first channel compressed output signal; and a second peak detector in the second hearing aid for detecting an occurrence of a signal peak of the second channel compressed output signal, wherein said first signal channel further comprises:

a first channel peak detector for detecting a signal peak of the first channel input signal, and generating a first channel control signal based at least in part on the detected signal peak of the first channel input signal;

a first channel gain adjustor for adjusting the first channel control signal;

a first channel compressing unit for performing a dynamic range compression, said first channel compressing unit receiving the first channel input signal and outputting the first channel dynamic range compressed signal in accordance with the adjusted first channel control signal; and a first channel attenuator for attenuating the first channel dynamic range compressed signal in accordance with a first channel attenuation factor to generate the first channel dynamic range compressed output signal in order to compensate for hearing impairment, wherein said second signal channel further comprises:

a second channel peak detector for detecting a signal peak of the second channel input signal, and generating a second channel control signal based at least in part on the detected signal peak of the second channel input signal;

a second channel gain adjustor for adjusting the second channel control signal;

a second channel compressing unit for performing a dynamic range compression, said second channel compressing unit receiving the second channel input signal and outputting the second channel dynamic range compressed signal in accordance with the adjusted second channel control signal; and a second channel attenuator for attenuating the second channel dynamic range compressed signal in accordance with a second channel attenuation factor to generate the second channel dynamic range compressed output signal in order to compensate for the hearing impairment, and wherein the first channel attenuation factor is based on a detected signal peak of the second channel dynamic range compressed signal output, and the second channel attenuation factor is based on a detected signal peak of the first channel dynamic range compressed signal output.

39. The binaural hearing aid system of claim 38, in which the first channel peak detector for generating the first channel control signal is further based at least in part on the detected signal peak of the second channel input signal.

40. The binaural hearing aid system of claim 38, in which the second channel peak detector for generating the second channel control signal is further based at least in part on the detected signal peak of the first channel input signal.

41. The binaural hearing aid system of claim 38, wherein the first hearing aid is configured to be worn at a left ear, and the second hearing aid is configured to be worn at a right ear.

42. A hearing apparatus, comprising:
a first hearing aid configured for communicating with a second hearing aid, the first hearing aid having:
a first channel,
a first peak detector for detecting an occurrence of a signal peak of a first channel input signal,
a first gain adjustor coupled to said first peak detector for adjusting a first channel gain control signal based at least in part on the detected signal peak of the first channel input signal, and
a first channel compressing unit for receiving the first channel input signal for generating a first channel dynamic range compressed output in accordance with the first channel gain control signal;

wherein the second hearing aid includes a second channel, a second peak detector for detecting an occurrence of a signal peak of a second channel input signal, a second gain adjustor coupled to said second peak detector for adjusting a second channel gain control signal based at least in part on the detected signal peak of the second channel input signal, and a second channel compressing unit for receiving the second channel input signal for generating a second channel dynamic range compressed output in accordance with the second channel gain control signal; and wherein the first channel dynamic range compressed output is for causing a cross-suppression effect in an output signal of the second channel, and the second dynamic range compressed output is for causing a cross-suppression effect in an output signal of the first channel.

43. The hearing apparatus of claim 42, wherein the first and second channel dynamic range compressed outputs are for causing the respective cross-suppression effects at different times, and wherein the hearing apparatus further comprises the second hearing aid.

\* \* \* \* \*